(12) United States Patent
Litman et al.

(10) Patent No.: US 10,156,785 B2
(45) Date of Patent: Dec. 18, 2018

(54) INSPECTION OF A LITHOGRAPHIC MASK THAT IS PROTECTED BY A PELLICLE

(71) Applicant: Applied Materials Israel Ltd., Rehovot (IL)

(72) Inventors: Alon Litman, Ness Ziona (IL); Nir Ben-David Dodzin, Hod-Hasharon (IL); Albert Karabekov, Ashdod (IL); Alex Goldenshtein, Ness Ziona (IL)

(73) Assignee: Applied Materials Israel Ltd., Rehovot (IL)

( * ) Notice: Subject to any disclaimer, the term of this patent is extended or adjusted under 35 U.S.C. 154(b) by 39 days.

(21) Appl. No.: 15/177,226

(22) Filed: Jun. 8, 2016

(65) Prior Publication Data

US 2016/0282714 A1    Sep. 29, 2016

Related U.S. Application Data

(62) Division of application No. 13/948,975, filed on Jul. 23, 2013, now Pat. No. 9,366,954.

(51) Int. Cl.
*G03F 1/86* (2012.01)
*H01J 37/28* (2006.01)
(Continued)

(52) U.S. Cl.
CPC .......... *G03F 1/86* (2013.01); *G03F 1/62* (2013.01); *H01J 37/28* (2013.01); *G21K 1/062* (2013.01); *H01J 2237/164* (2013.01); *H01J 2237/2002* (2013.01); *H01J 2237/244* (2013.01); *H01J 2237/2449* (2013.01); *H01J 2237/2809* (2013.01); *H01J 2237/2817* (2013.01)

(58) Field of Classification Search
None
See application file for complete search history.

(56) References Cited

U.S. PATENT DOCUMENTS

| | | | | |
|---|---|---|---|---|
| 6,184,526 B1 * | 2/2001 | Kohama | ............... | H01J 37/28 250/310 |
| 6,427,703 B1 * | 8/2002 | Somekh | ............... | B82Y 10/00 134/1.1 |

(Continued)

OTHER PUBLICATIONS

U.S. Appl. No. 13/948,975 , "Non-Final Office Action", dated Sep. 3, 2015, 29 pages.

(Continued)

*Primary Examiner* — Andrew Smyth
(74) *Attorney, Agent, or Firm* — Kilpatrick Townsend & Stockton LLP (57) ABSTRACT

A system and a method for evaluating a lithography mask, the system may include: (a) electron optics for directing primary electrons towards a pellicle that is positioned between the electron optics and the lithography mask; wherein the primary electrons exhibit an energy level that allows the primary electrons to pass through the pellicle and to impinge on the lithographic mask; (b) at least one detector for detecting detected emitted electrons and for generating detection signals; wherein detected emitted electrons are generated as a result of an impingement of the primary electrons on the lithographic mask; and (c) a processor for processing the detection signals to provide information about the lithography mask.

10 Claims, 6 Drawing Sheets

(51) Int. Cl.
*G03F 1/62* (2012.01)
*G21K 1/06* (2006.01)

(56) References Cited

U.S. PATENT DOCUMENTS

| | | | |
|---|---|---|---|
| 7,252,910 B2* | 8/2007 | Hasegawa | G03F 1/64 430/5 |
| 7,422,828 B1* | 9/2008 | Kim | G03F 1/44 356/237.5 |
| 2003/0143472 A1* | 7/2003 | Koizumi | G03F 1/56 430/5 |
| 2004/0151993 A1* | 8/2004 | Hasegawa | G03F 1/64 430/5 |
| 2011/0155905 A1* | 6/2011 | Hatakeyama | H01J 37/244 250/307 |
| 2015/0028203 A1 | 1/2015 | Litman et al. | |

OTHER PUBLICATIONS

U.S. Appl. No. 13/948,975, "Notice of Allowance", dated Feb. 19, 2016, 14 pages.

\* cited by examiner

INSPECTION OF A LITHOGRAPHIC MASK THAT IS PROTECTED BY A PELLICLE

CROSS-REFERENCE TO RELATED APPLICATIONS

The present application is a divisional of U.S. application Ser. No. 13/948,975, filed Jul. 23, 2013, the entire contents of which are incorporated herein by reference in their entirety for all purposes.

BACKGROUND OF THE INVENTION

Extreme ultra violet (EUV) lithographic masks are used during the manufacturing process of semiconductor wafers and other modern electrical components. Defects of EUV lithographic masks are duplicated on multiple electrical components and thus are very costly. In order to protect EUV lithographic masks these masks are usually covered (or placed below) by pellicles.

EUV lithographic masks should be inspected in order to detect defects. The detection typically includes scanning the EUV lithographic masks with low energy electrons and detecting these low energy electrons.

It has been found that some modern pellicles prevent (or at least dramatically reduce) the passage of low energy electrons through the pellicles and thus prevent inspection of EUV lithographic masks that are protected by pellicles.

There is a growing need to inspect EUV lithographic masks that are protected by pellicles.

SUMMARY

According to an aspect of the invention, there are provided a method and a system for inspecting EUV lithographic masks that are protected by pellicles. According to an embodiment of the invention, the method comprises: directing by electron optics, primary electrons towards a pellicle that is positioned between the electron optics and the lithography mask; wherein the primary electrons exhibit an energy level that allows the primary electrons to pass through the pellicle and to impinge on the lithographic mask; detecting, by at least one detector, detected emitted electrons and generating detection signals; wherein detected emitted electrons are generated as a result of an impingement of the primary electrons on the lithographic mask; and processing, by a processor, the detection signals to provide information about the lithography mask.

According to another embodiment of the invention, there is provided a system for evaluating lithography mask, the system comprises: electron optics for directing primary electrons towards a pellicle that is positioned between the electron optics and the lithography mask; wherein the primary electrons exhibit an energy level that allows the primary electrons to pass through the pellicle and to impinge on the lithographic mask; at least one detector for detecting detected emitted electrons and for generating detection signals; wherein detected emitted electrons are generated as a result of an impingement of the primary electrons on the lithographic mask; and a processor for processing the detection signals to provide information about the lithography mask.

According to another embodiment, there is provided a method for evaluating a lithographic mask, the method comprises: receiving detection signals; wherein the detection signals are generated by at least one detector that detects detected emitted electrons; wherein the detected emitted electrons are generated as a result of directing by electron optics, primary electrons towards a pellicle that is positioned between the electron optics and the lithography mask; wherein the primary electrons exhibit an energy level that allows the primary electrons to pass through the pellicle and to impinge on the lithographic mask; and processing, by a processor, the detection signals to provide information about the lithography mask.

According to yet another embodiment of the invention, there is provided a system for evaluating lithography mask, the system comprises: an interface for receiving detection signals; wherein the detection signals are generated by at least one detector that detects detected emitted electrons; wherein the detected emitted electrons are generated as a result of directing by electron optics, primary electrons towards a pellicle that is positioned between the electron optics and the lithography mask; wherein the primary electrons exhibit an energy level that allows the primary electrons to pass through the pellicle and to impinge on the lithographic mask; and a processor for processing the detection signals to provide information about the lithography mask.

According to an embodiment of the invention, there is provided a non-transitory computer readable medium that stores instructions for: receiving detection signals; wherein the detection signals are generated by at least one detector that detects detected emitted electrons; wherein the detected emitted electrons are generated as a result of directing by electron optics, primary electrons towards a pellicle that is positioned between the electron optics and a lithography mask; wherein the primary electrons exhibit an energy level that allows the primary electrons to pass through the pellicle and to impinge on the lithographic mask; and processing the detection signals to provide information about the lithography mask.

According to various embodiments of the invention: the detected emitted electrons can be backscattered electrons that are emitted from the lithographic mask; the detected emitted electrons may exclude secondary electrons emitted from the pellicle due to an interaction of the primary electrons with the pellicle; the detected emitted electrons may exclude secondary electrons emitted from the pellicle due to an interaction of the backscattered electrons with the pellicle; the detected emitted electrons may exclude secondary electrons emitted from the pellicle due to (a) an interaction of the primary electrons with the pellicle and due to (b) an interaction of the backscattered electrons with the pellicle; the detected emitted electrons may be secondary electrons that are emitted from the pellicle due to an interaction of the backscattered electrons with the pellicle, wherein the backscattered electrons are emitted from the lithographic mask; the detected emitted electrons may exclude electrons emitted from the pellicle due to an interaction of the primary electrons with the pellicle; the detected emitted electrons exclude the backscattered electrons; the detected emitted electrons may exclude secondary electrons emitted from the pellicle due to an interaction of the primary electrons with the pellicle and masking the backscattered electrons.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be under-

3 stood by reference to the following detailed description when read with the accompanying drawings in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

According to an embodiment of the invention there is provided a method and system for evaluating a lithography mask such as an extreme ultra violet (EUV) lithography mask and especially a 16 nanometer EUV lithography mask.

Figure 1:
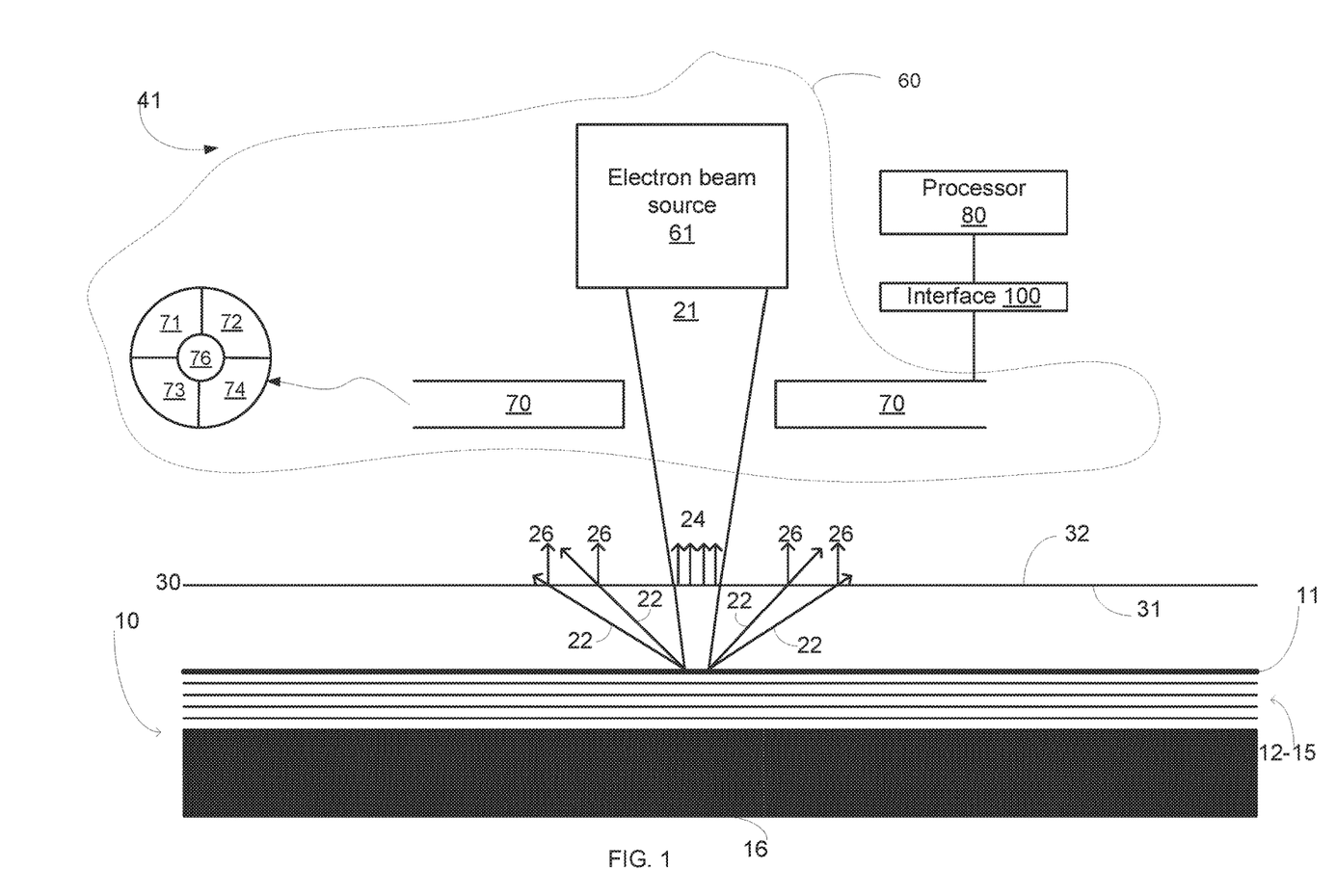
FIG. 1 illustrates a system, a mask and a pellicle according to an embodiment of the invention.
Figure 2:
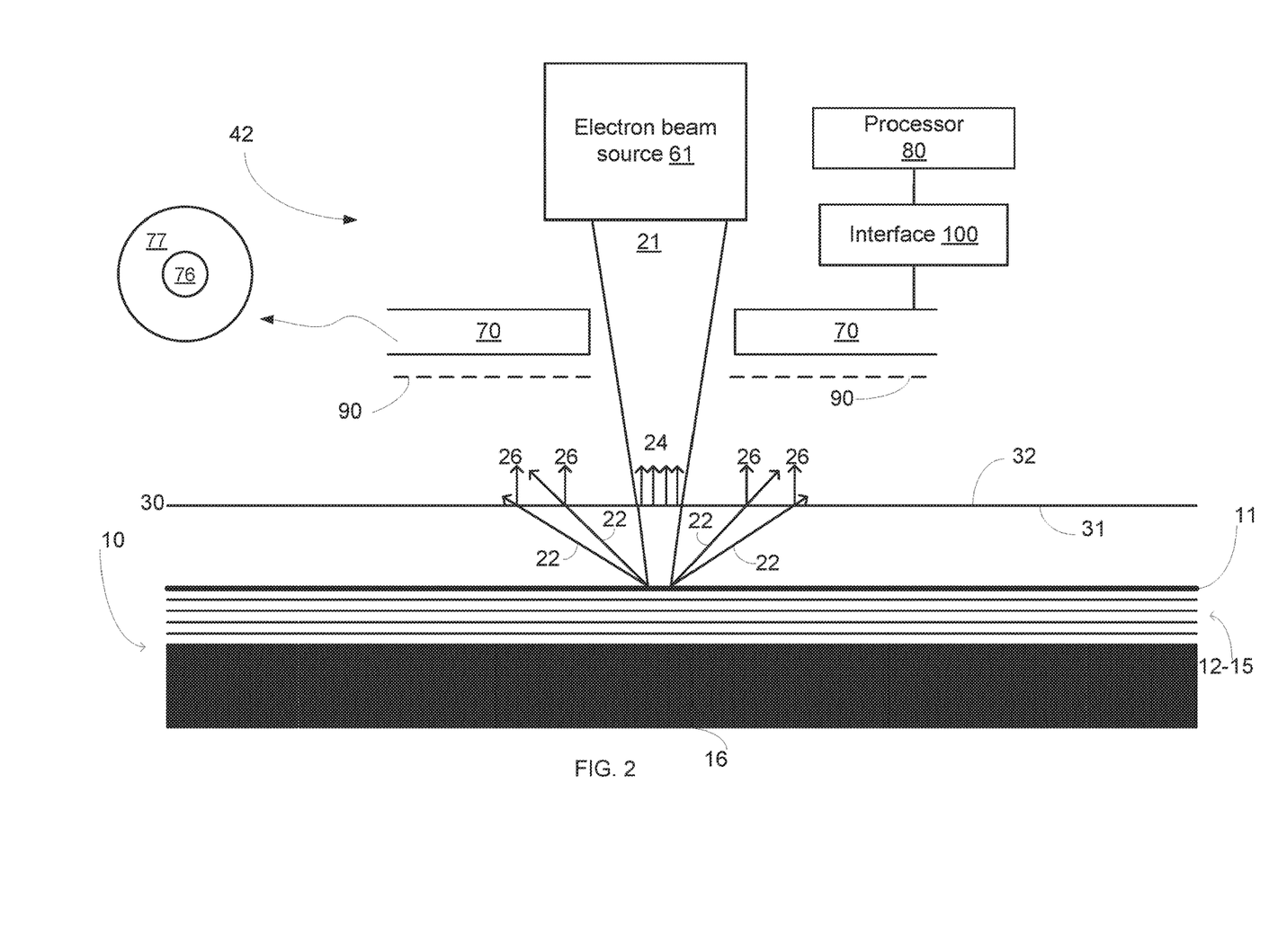
FIG. 2 illustrates a system, a mask and a pellicle according to an embodiment of the invention.
Figure 3:
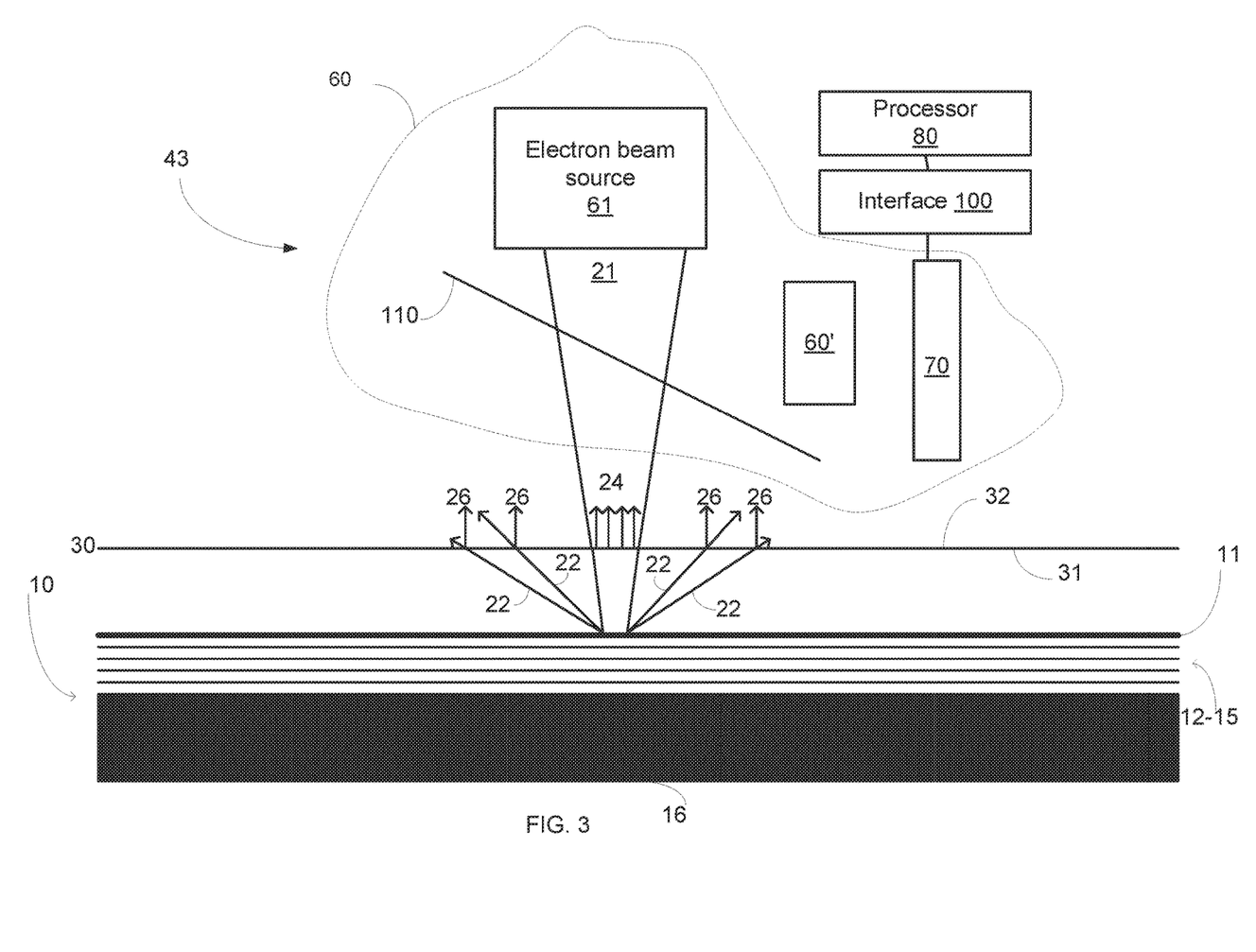
FIG. 3 illustrates a system, a mask and a pellicle according to an embodiment of the invention.
Figure 4:
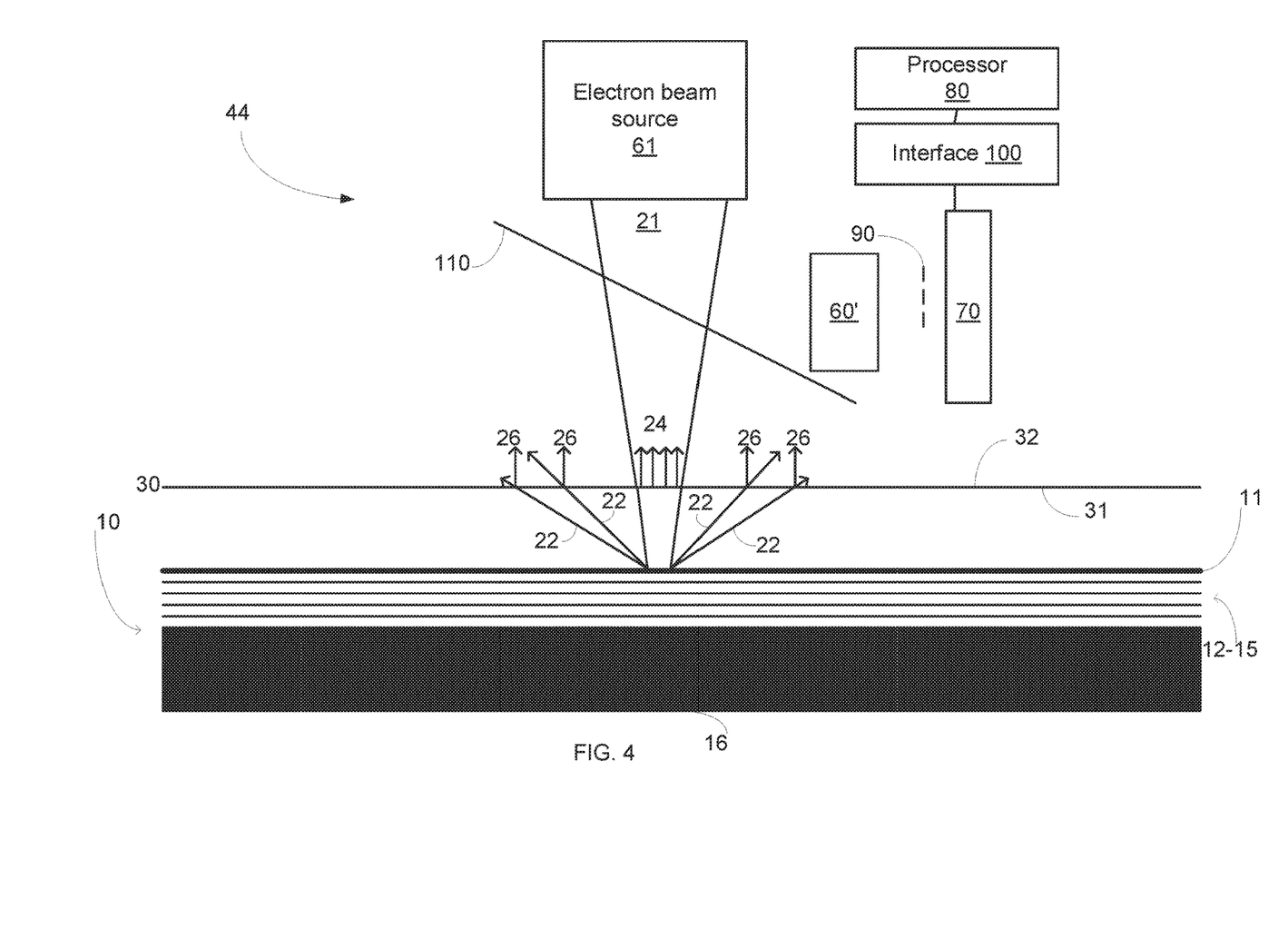
FIG. 4 illustrates a system, a mask and a pellicle according to an embodiment of the invention.

FIG. 1 illustrates a system 41 for evaluating a lithography mask 10 according to an embodiment of the invention. FIG. 2 illustrates a system 42 for evaluating a lithography mask 10 according to an embodiment of the invention. FIG. 3 illustrates a system 43 for evaluating a lithography mask 10 according to an embodiment of the invention. FIG. 4 illustrates a system 44 for evaluating a lithography mask 10 according to an embodiment of the invention.

The lithography mask 10 can be an extreme ultra violet EUV lithographic mask and may be a 16 nanometer EUV lithographic mask. It is illustrated in FIGS. 1-4 as including an upper layer 11, multiple intermediate layers 12-15 and a substrate (bulk) 16.

System 41 includes:

a. Electron optics 60 for directing primary electrons 21 towards a pellicle 30 that is positioned between the electron optics 60 and the lithography mask 10. The primary electrons 21 can be generated by electron beam source 61 of the electron optics 60. The primary electrons exhibit an energy level that allows the primary electrons to pass through the pellicle 30 and to impinge on the lithographic mask 10. Electron optics 60 may include any element that can affect the trajectory of the primary electrons 21 as well as their landing energy, or any other characteristics. The electron optics 60 may include one or more lenses, one or more apertures, one or more filters, one or more beam shaping elements, one or more beam splitters, one or more collimators, one or more deflectors, one or more accelerating elements, one or more de-accelerating elements, and may include an electron source. The electron optics 60 may include one or more detectors such as detector 70.

b. Detector 70 for detecting detected emitted electrons and for generating detection signals indicative of the detected emitted electrons. The detected emitted electrons are generated as a result of an impingement of the primary electrons on the lithographic mask.

c. Interface 100 for receiving the detection signals. The interface 100 may be a communication port, a memory module and the like.

d. Processor 80 for processing the detection signals to provide information about the lithography mask.

The system can include more than a single detector. The detector 70 can have multiple separate segments—each arranged to generate detection signals reflecting the detected emitted electrons it detected. In FIG. 1 the detector 70 is shown as being of an annular shape and four segments 71-74 that surround central aperture 76. It is noted that the number, shape and size of detector can differ from those illustrated in FIG. 1. For example, in FIG. 2 the detector 70 has a single annular segment 77 that surrounds aperture 76.

The primary electrons 21 form a primary beam that passes through the pellicle 30 and this passage causes the pellicle 30 to emit a first group of emitted secondary electrons SE1 24.

The primary electrons 21 impinge onto the lithographic mask 10 and result in an emission of backscattered electrons BSE 22.

The backscattered electrons 22 may pass through the pellicle 30 and may case the pellicle 30 to emit a second group of secondary electrons SE2 26.

It is noted that the impingement of the primary electrons 21 onto the lithographic mask 10 results in an emission of secondary electrons (not shown) that do not manage to pass through the pellicle 30 and be detected.

The term "emitted electrons" may refer to the combination of backscattered electrons 22, the first group of electrons SE1 24 and the second group of electrons SE2 26.

The term "detected emitted electrons" may refer to the part of the emitted electrons that are detected by the at least one detector 70. For example, even if the system 41 may be designed to detect emitted electrons of a certain type (BSE, SE1 and/or SE2) it may occur that only some of these certain type of electrons are detected.

Furthermore, according to various embodiments of the invention one or more types of electrons (outs of SE1, SE2 and BSE) may be masked. This can be implemented by various known masking methods including spatial filters and energy filters.

System 42 of FIG. 2 differs from system 41 of FIG. 1 by including energy filters 90 between detector 70 and the pellicle 30. These energy filters 90 can be set for masking secondary electrons such as those that belong to the second group of secondary electrons SE2 26.

System 43 of FIG. 3 differs from system 41 of FIG. 1 by having a beam splitter 110 that is positioned above the pellicle 30 and directs emitted electrons towards detector 70. This arrangement can allow the plane of the pellicle 30 to be imaged onto the detector 70 although non-imaging detection can be applied by system 43. It is noted that the electron optics 60 may include the beam splitter 110. The electron optics 60 can include lenses or any other electro-static components (60') positioned between the beam splitter 110 and detector 70 to focus the SE electron 24 and 26 on detector 70.

System 44 of FIG. 4 differs from system 41 of FIG. 1 by including a beam splitter energy 110 positioned above the pellicle 30 and an energy filter 90 that can be set for masking secondary electrons such as those that belong to the first group of secondary electrons SE1 24.

It is noted that the masking can be achieved by the position and shape of the detector 70. The detector 70 can be positioned and shaped in locations in which it is expected to detect emitted electrons of one type and not emitted electrons of another type. For example, the detector 70 can have (see FIG. 1) a central aperture that allows passage of the primary electrons 21 and also allows a passage of emitted electrons of the first group of secondary electrons SE1 24 to pass through without being detected.

Figure 5:
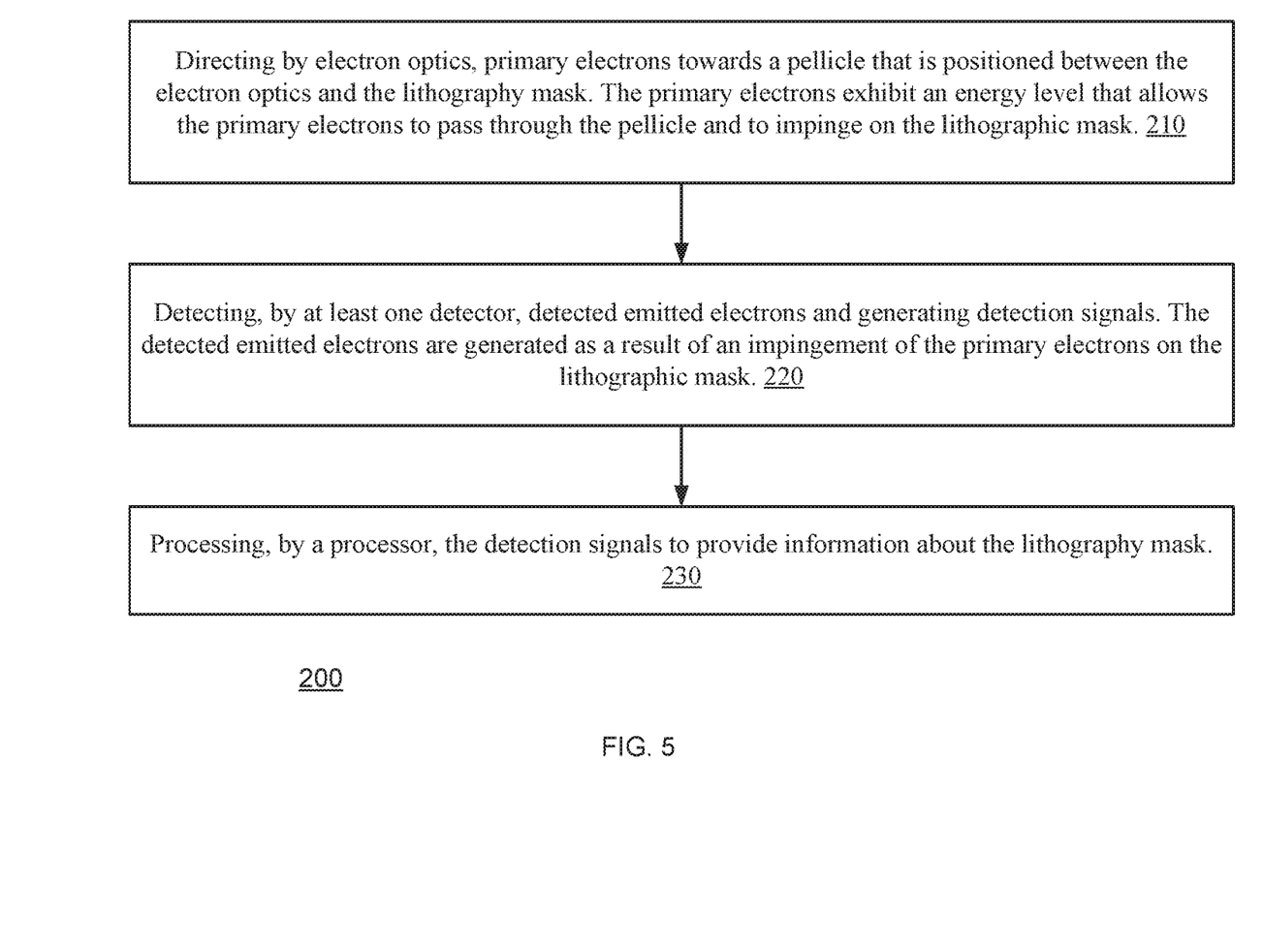
FIG. 5 illustrates a method according to an embodiment of the invention.

FIG. 5 illustrates method 200 according to an embodiment of the invention.

Method 200 may start by stage 210 of directing by electron optics, primary electrons towards a pellicle that is positioned between the electron optics and the lithography mask. The primary electrons exhibit an energy level that allows the primary electrons to pass through the pellicle and to impinge on the lithographic mask.

Stage 210 may be followed by stage 220 of detecting, by at least one detector, detected emitted electrons and generating detection signals. The detected emitted electrons are generated as a result of an impingement of the primary electrons on the lithographic mask.

Stage 220 may include detecting detected emitted electrons that are backscattered electrons that are emitted from the lithographic mask (detecting BSE). Stage 220 may also include at least one out of (a) masking secondary electrons emitted from the pellicle due to an interaction of the primary electrons with the pellicle (masking SE1), and (b) masking secondary electrons emitted from the pellicle due to an interaction of the backscattered electrons with the pellicle (masking SE2).

The detecting of the detected electrons can be performed by a detector that includes multiple backscattered electron detection elements.

Stage 220 may include detecting detected emitted electrons that are secondary electrons that are emitted from the pellicle due to an interaction of the backscattered electrons with the pellicle (detecting SE2), wherein the backscattered electrons are emitted from the lithographic mask. Stage 220 may also include at least one out of: (a) masking secondary electrons emitted from the pellicle due to an interaction of the primary electrons with the pellicle (masking SE1), and (b) masking the backscattered electrons (masking BSE).

Stage 220 may include imaging the plane of the pellicle on the at least one detector.

Stage 220 may be followed by stage 230 of processing, by a processor, the detection signals to provide information about the lithography mask. The information can be indicative of the state of the lithographic mask, defects of the lithographic mask, shape of the lithographic mask and the like.

The processing can include any known method or process for extracting information from detection signals.

Figure 6:
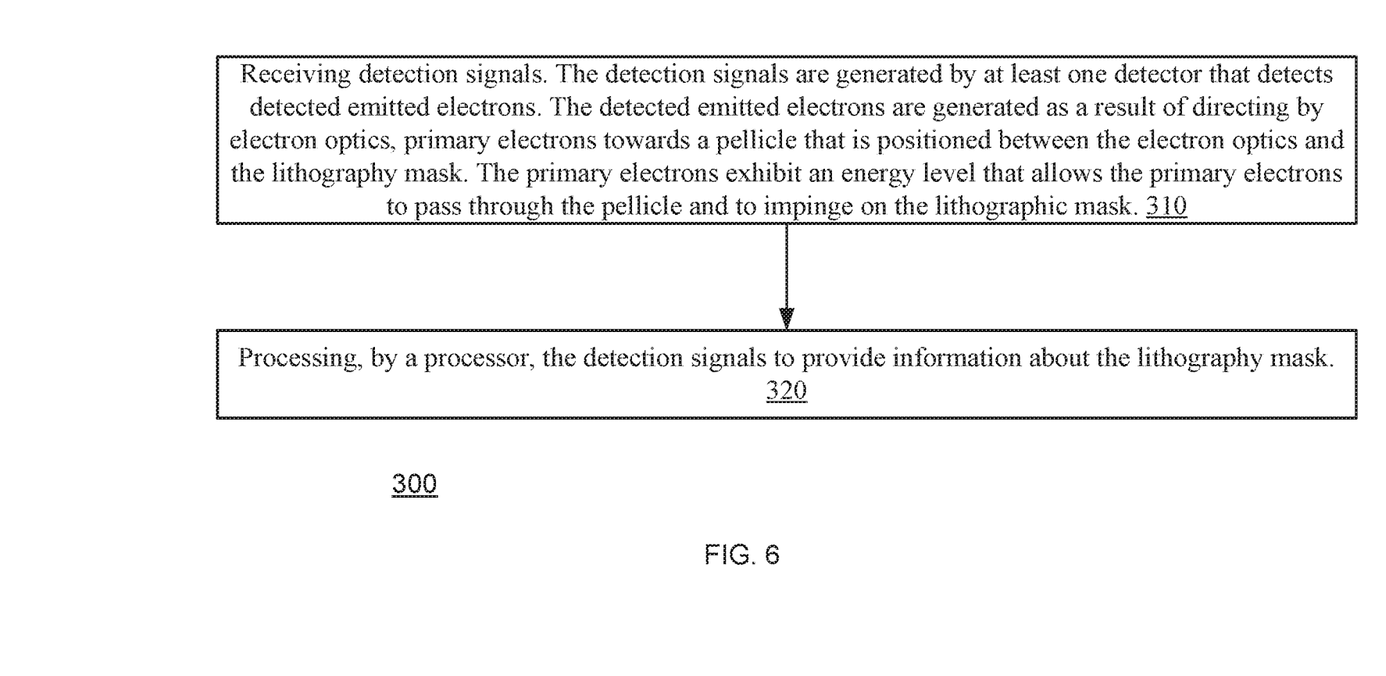
FIG. 6 illustrates a method according to an embodiment of the invention.

FIG. 6 illustrates method 300 according to an embodiment of the invention.

Method 300 may start by stage 310 of receiving detection signals. The detection signals are generated by at least one detector that detects detected emitted electrons. The detected emitted electrons are generated as a result of directing by electron optics, primary electrons towards a pellicle that is positioned between the electron optics and the lithography mask. The primary electrons exhibit an energy level that allows the primary electrons to pass through the pellicle and to impinge on the lithographic mask.

The detected emitted electrons may include backscattered electrons that are emitted from the lithographic mask (detecting BSE). The detected emitted electrons may exclude at least one out of (a) secondary electrons emitted from the pellicle due to an interaction of the primary electrons with the pellicle (masking SE1), and (b) secondary electrons emitted from the pellicle due to an interaction of the backscattered electrons with the pellicle (masking SE2).

The detected emitted electrons may include secondary electrons that are emitted from the pellicle due to an interaction of the backscattered electrons with the pellicle (detecting SE2), wherein the backscattered electrons are emitted from the lithographic mask. The detected emitted electrons may exclude at least one out of (a) secondary electrons emitted from the pellicle due to an interaction of the primary electrons with the pellicle (masking SE1), and (b) backscattered electrons (masking BSE).

Stage 310 may be followed by stage 320 of processing, by a processor, the detection signals to provide information about the lithography mask. The information can be indicative of the state of the lithographic mask, defects of the lithographic mask, shape of the lithographic mask and the like.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for evaluating a lithography mask, the method comprising:
   directing, by electron optics, primary electrons towards a
      pellicle that is positioned between the electron optics and the lithography mask; wherein at least a portion of the primary electrons pass through the pellicle and impinge on the lithography mask;

detecting, by at least one detector, detected emitted electrons and generating detection signals; wherein the detected emitted electrons are secondary electrons that are emitted from the pellicle due to an interaction of backscattered electrons with the pellicle, wherein the backscattered electrons are generated as a result of an impingement of the portion of the primary electrons on the lithography mask, and the secondary electrons are generated as a result of an impingement of the backscattered electrons on the pellicle, the backscattered electrons traveling from emission points on the lithography mask to impingement points on a backside of the pellicle, and the secondary electrons traveling from emission points on a frontside of the pellicle to the at least one detector; and processing, by a processor, the detection signals to provide information about the lithography mask.

2. A method for evaluating a lithography mask, the method comprising:

directing, by electron optics, primary electrons towards a pellicle that is positioned between the electron optics and the lithography mask, wherein at least a portion of the primary electrons pass through the pellicle and impinge on the lithography mask;

masking secondary electrons emitted from the pellicle due to an interaction of the primary electrons with the pellicle;

detecting, by at least one detector, detected emitted electrons and generating detection signals, wherein the detected emitted electrons are detected secondary electrons that are emitted from the pellicle due to an interaction of backscattered electrons with the pellicle, wherein the backscattered electrons are generated as a result of an impingement of the portion of the primary electrons on the lithography mask, and the detected secondary electrons are generated as a result of an impingement of the backscattered electrons on the pellicle; and processing, by a processor, the detection signals to provide information about the lithography mask.

3. The method according to claim 1, further comprising masking the backscattered electrons passing through the pellicle.

4. The method according to claim 1, further comprising masking secondary electrons emitted from the pellicle due to an interaction of the primary electrons with the pellicle and masking the backscattered electrons passing through the pellicle.

5. The method according to claim 1, further comprising imaging the plane of the pellicle on the at least one detector.

6. A system for evaluating a lithography mask, the system comprising:

electron optics for directing primary electrons towards a pellicle that is positioned between the electron optics and the lithography mask; wherein the primary electrons exhibit an energy level that allows at least a portion of the primary electrons to pass through the pellicle and to impinge on the lithography mask;

at least one detector for detecting detected emitted electrons and for generating detection signals; wherein the detected emitted electrons are secondary electrons that are emitted from the pellicle due to an interaction of backscattered electrons with the pellicle, wherein the backscattered electrons are generated as a result of an impingement of the portion of the primary electrons on the lithography mask, and the secondary electrons are generated as a result of an impingement of the backscattered electrons on the pellicle, the backscattered electrons traveling from emission points on the lithography mask to impingement points on a backside of the pellicle, and the secondary electrons traveling from emission points on a frontside of the pellicle to the at least one detector; and a processor for processing the detection signals to provide information about the lithography mask.

7. The system according to claim 6, wherein the system is arranged to mask secondary electrons emitted from the pellicle due to an interaction of the primary electrons with the pellicle.

8. The system according to claim 6, wherein the system is arranged to mask the backscattered electrons passing through the pellicle.

9. The system according to claim 6, wherein the system is arranged to mask secondary electrons emitted from the pellicle due to an interaction of the primary electrons with the pellicle and to mask the backscattered electrons passing through the pellicle.

10. The system according to claim 6, wherein the electron optics is arranged to image the plane of the pellicle on the at least one detector.

* * * * *